(12) United States Patent
Mauger et al.

(10) Patent No.: US 11,026,337 B2
(45) Date of Patent: Jun. 1, 2021

(54) ELECTRONIC CONTROL UNIT

(71) Applicant: VEONEER SWEDEN AB, Vargarda (SE)

(72) Inventors: Thomas Mauger, Enghien-les-Bains (FR); Alexandre Mensales, Cedex (FR)

(73) Assignee: VEONEER SWEDEN AB, Vargarda (SE)

( * ) Notice: Subject to any disclaimer, the term of this patent is extended or adjusted under 35 U.S.C. 154(b) by 0 days.

(21) Appl. No.: 16/652,635

(22) PCT Filed: Oct. 3, 2018

(86) PCT No.: PCT/EP2018/076893
§ 371 (c)(1),
(2) Date: Mar. 31, 2020

(87) PCT Pub. No.: WO2019/068751
PCT Pub. Date: Apr. 11, 2019

(65) Prior Publication Data
US 2020/0245480 A1 Jul. 30, 2020

(30) Foreign Application Priority Data
Oct. 4, 2017 (EP) ..................................... 17194789

(51) Int. Cl.
*H05K 5/00* (2006.01)
*H05K 7/20* (2006.01)

(52) U.S. Cl.
CPC ........... *H05K 5/0073* (2013.01); *H05K 5/006* (2013.01); *H05K 5/0052* (2013.01); *H05K 5/0056* (2013.01); *H05K 7/20009* (2013.01)

(58) Field of Classification Search
None
See application file for complete search history.

(56) References Cited

U.S. PATENT DOCUMENTS 8,437,134 B2 * 5/2013 Sarginger ............. H05K 5/0073
361/688
8,878,059 B2 11/2014 Makino
(Continued)

FOREIGN PATENT DOCUMENTS

| CN | 206341514 U | 7/2017 |
|---|---|---|
| CN | 206490935 U | 9/2017 |
| DE | 10346990 A1 | 5/2005 |

OTHER PUBLICATIONS

International Search Report and Written Opinion of PCT/EP2018/076893 dated Dec. 6, 2018.

*Primary Examiner* — Courtney L Smith
(74) *Attorney, Agent, or Firm* — Dickinson Wright PLLC

(57) ABSTRACT

There is disclosed a motor vehicle electronic control unit casing. The casing includes a housing (1) for electronic components, and a cover (15). The housing and cover (15) are inter-engageable. The housing (1) has a base (2), and an upstanding peripheral side wall (3) defining a peripheral edge (4) in spaced relation to the base (2) and which extends around an access opening of the housing. The cover (15) has a closure part (16) and is configured to close the access opening via engagement between the closure part (16) and the housing (1) around the peripheral edge (4). The cover (15) also has a mounting portion configured to be mounted to a mounting surface (27) in a motor vehicle. The mounting portion depends from the closure part (16) so as to extend substantially alongside the peripheral sidewall of the housing (1) when the housing and the cover (15) are inter-engaged to close the access opening, the mounting portion thereby being configured to secure the housing relative to the mounting surface (27) such that the peripheral edge (4) is spaced from the mounting surface (27).

18 Claims, 5 Drawing Sheets

(56) References Cited

U.S. PATENT DOCUMENTS

| | | | | |
|---|---|---|---|---|
| 9,578,761 | B2* | 2/2017 | Chitaka | H05K 7/14 |
| 9,788,445 | B2 | 10/2017 | Hashimoto et al. | |
| 10,645,823 | B2* | 5/2020 | Watanabe | H05K 5/0052 |
| 2008/0074840 | A1* | 3/2008 | Suzuki | H05K 5/0213 |
| | | | | 361/679.46 |
| 2013/0032371 | A1 | 2/2013 | Makino | |
| 2013/0250521 | A1* | 9/2013 | Kawai | H05K 5/0082 |
| | | | | 361/714 |
| 2016/0295724 | A1* | 10/2016 | Fujii | H05K 5/0052 |
| 2017/0238435 | A1 | 8/2017 | Hashimoto et al. | |
| 2017/0367199 | A1* | 12/2017 | Hugaud | H05K 5/0047 |

\* cited by examiner

ELECTRONIC CONTROL UNIT

CROSS-REFERENCE TO RELATED APPLICATIONS

This application is a 35 U.S.C. § 371 national phase of PCT International Application No. PCT/EP2018/076893, filed Oct. 3, 2018, which claims the benefit of priority under 35 U.S.C. § 119 to European Patent Application No. 17194789.8, filed Oct. 4, 2017, the contents of which are incorporated herein by reference in their entirety.

FIELD OF THE INVENTION

The present invention relates to a motor vehicle electronic control unit casing and to a motor vehicle electronic control unit including a motor vehicle electronic control unit casing.

BACKGROUND

Modern motor vehicles are equipped with many electronic control units (ECUs) which control the various electrical systems of the vehicles. ECUs include electronics for performing the operations which control the various vehicle systems and often include a connector for connecting the electronics of the ECU to other electronics of the vehicle. Some examples of ECUs are engine control modules, transmission control modules, brake control modules, suspension control modules, and central timing modules.

ECUs are often conveniently located nearby to the component or system which they control. For example, a suspension control module may be located near the wheels. As discussed above, ECUs are used for a wide variety of functions and as such are located in a wide variety of positions in a motor vehicle. Accordingly, some ECUs are located in positions in the motor vehicle in which water may be present. It is important to avoid water contacting the electronics of ECUs as this may lead to short circuiting of the electronics causing damage. Thus, ECUs often include a casing for preventing water simply running onto the electronics.

Previously proposed casings consist of a plate on which a printed circuit board (PCB) is mounted and a casing body which covers the PCB and seals against the plate. The plate or casing body is then attached, in the region of the plate, to a surface in the vehicle. The seal between the casing body and the plate must be water tight in order to prevent water from entering the casing and contacting the electronics. However, a high standard of water tight seal is difficult to produce or may degrade over time, for example due to the vibrations of the motor vehicle in which the casing is mounted. Thus the seal can become flawed and water may leak into the casing and cause damage to the electronics of the ECU.

Other previously proposed ECUs and casings are arranged not have a seal at all. In this type of casing water can enter and drain from the casing freely beneath side walls of the casing which are held above the surface on which the casing is mounted. The casing has an upper wall and side walls. The circuit board is mounted below the upper wall and the connector is located at a lower position than the circuit board so that water entering the ECU through a gap around the connector will fall away from the circuit board due to gravity. However, due to the considerable vibration and movement that takes place in a vehicle, water that has entered a casing of this type may be splashed onto the circuit board. Furthermore, ECUs may be located near a heat source (such as near the engine of the vehicle) and so water vapour may enter the casing and cause droplets to form on the circuit board.

It is therefore an object of the present invention to provide an improved motor vehicle electronic control unit casing.

SUMMARY AND INTRODUCTORY DESCRIPTION OF EMBODIMENTS OF THE INVENTION

According to the present invention, there is provided a motor vehicle electronic control unit casing comprising a housing for electronic components, and a cover, the housing and cover being inter-engageable. The housing has a base, and an upstanding peripheral side wall defining a peripheral edge in spaced relation to the base. The peripheral edge extends around an access opening of the housing. The cover has a closure part and is configured to close the access opening via engagement between the closure part and the housing around the peripheral edge. The cover has a mounting portion configured to be mounted to a mounting surface in a motor vehicle. The mounting portion depends from the closure part so as to extend substantially alongside the peripheral sidewall of the housing when the housing and the cover are inter-engaged to close the access opening. The mounting portion is thereby configured to secure the housing relative to the mounting surface such that the peripheral edge is spaced from the mounting surface.

Advantageously, the mounting portion is configured to secure the housing relative to the mounting surface such that the peripheral edge is spaced from the mounting surface by at least the distance by which the peripheral edge is spaced from the base.

Conveniently, the mounting portion is configured to secure the housing relative to the mounting surface such that the peripheral edge is spaced from the mounting surface by at least 20 mm.

Optionally, the closure part of the cover is configured to engage the housing along the peripheral edge of the housing, to thereby close the access opening of the housing.

Preferably, the housing further includes a connector for electrically connecting electronic components within the housing to electronics outside of the housing.

Conveniently, when the housing and the cover are inter-engaged to close the access opening, the mounting portion extends substantially alongside two opposing regions of the peripheral side wall.

Optionally, when the housing and the cover are inter-engaged to close the access opening, the cover substantially covers all of the housing except the base and the connector.

Preferably, the closure part has a raised section such that, when the housing and the cover are inter-engaged to close the access opening, the raised section is spaced from the access opening.

Advantageously, the cover has a vent aperture through the raised section.

Conveniently, the mounting portion further includes a foot portion distal to the closure part, the foot portion extending away from the housing and the foot portion being configured for securing the casing to the mounting surface.

Optionally, there is provided a motor vehicle electronic control unit including a motor vehicle electronic control unit casing as described above, and further comprising electronic componentry located within the casing.

Preferably, the componentry includes an electronic component located proximal to the access opening.

Conveniently, a heat dissipation chamber is defined between the electronic component and the raised section.

Advantageously, the componentry includes an electronic component which is clamped to the housing.

Conveniently, the component is clamped between the housing and the cover by virtue of inter-engagement of the housing and the cover.

BRIEF DESCRIPTION OF THE DRAWINGS

So that the invention may be more readily understood, and so that further features thereof may be appreciated, embodiments of the invention will now be described by way of example with reference to the accompanying drawings in which.

DETAILED DESCRIPTION

Figure 1:
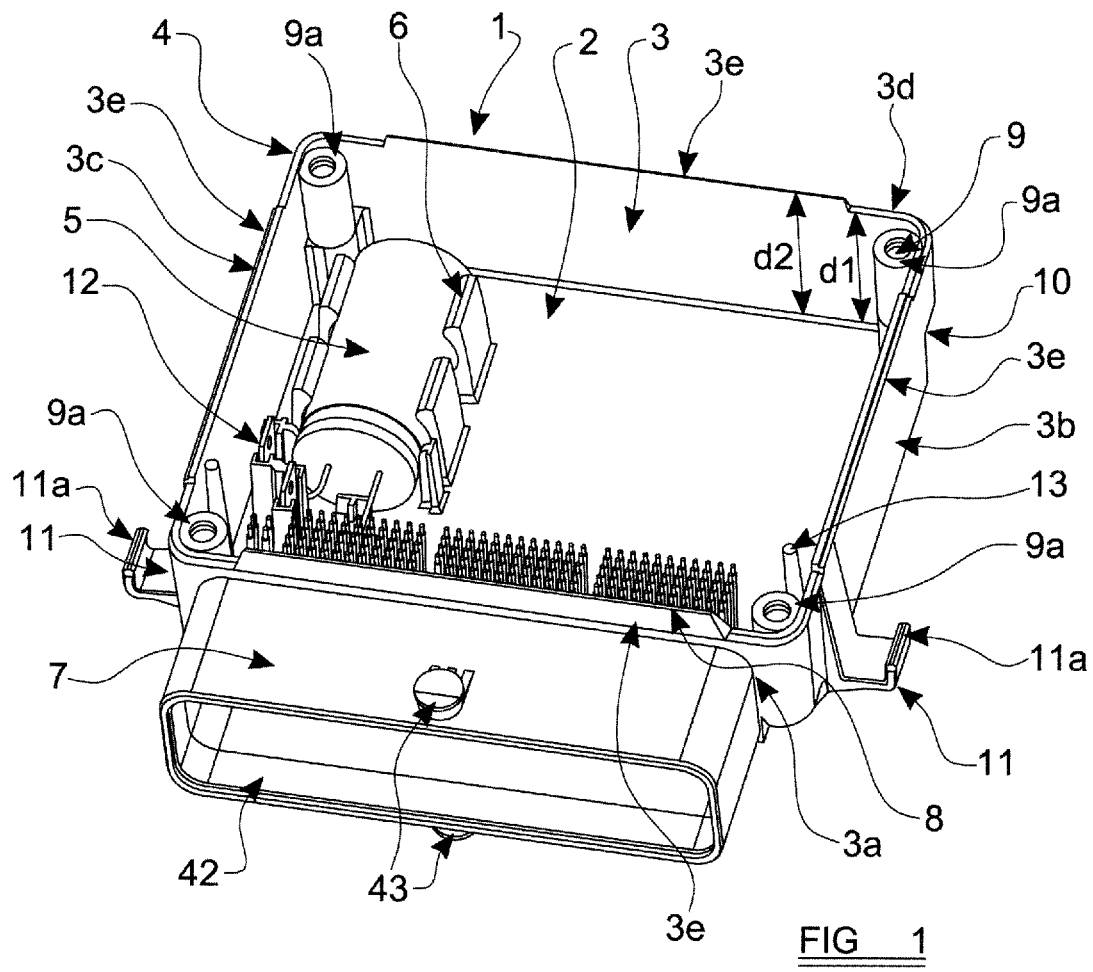
FIG. 1 is a perspective view of a housing of an electronic control unit according to the present invention, showing ECU electronics located within the housing.

Considering the drawings in more detail, FIG. 1 shows a housing 1 having a base 2 and an upstanding peripheral side wall 3. The base 2 is planar and substantially rectangular. In other embodiments, the base 2 need not be planar and/or may be of another shape.

The side wall 3 extends upwardly from the base 2 and around the periphery of the base 2 and is water impermeable. It is envisaged that the sidewall 3 may be formed integrally with the base 2 as a unitary moulding of, for example, plastics material. The side wall 3 defines an uppermost peripheral edge 4 which is located in spaced relation to the base 2. In the particular embodiment illustrated, the side wall 3 is substantially perpendicular to the plane of the base 2. In other embodiments, however, the side wall 3 may be at another angle to the plane of the base 2, so as to thereby extend diagonally from the plane of the base 2.

The peripheral edge 4 extends around an access opening. Electronic components can be inserted through the access opening into the housing 1. In FIG. 1, the peripheral edge 4 defines the perimeter of the access opening, but in other embodiments, the access opening may be smaller so that the peripheral edge 4 may extend around the access opening but not actually define the perimeter of the access opening. The housing 1 may include a portion which protrudes inwardly from the peripheral edge 4 to define an access opening spaced inwardly of the peripheral edge 4.

The side wall 3 consists of four straight portions that meet at rounded corners to form a generally rectangular shape with rounded corners that generally matches the shape of the base 2. There are four straight portions; a front portion 3a, two opposing side portions 3b, 3c and a back portion 3d.

The peripheral edge 4 is in spaced relation to the base 2. In the particular embodiment illustrated, the corner regions of the peripheral edge are each spaced above the base 2 by an equal first distance d1. As will thus be appreciated, the corner regions of the peripheral edge 4 thus all lie in a common plane which is parallel to the plane of the base 2. However, the peripheral edge has a somewhat crenelated configuration, due to the provision of respective raised linear sections 3e provided centrally along each straight portion 3a, 3b, 3c, 3d of the side wall 3. Each raised linear portion is spaced above the base 2 by an equal second distance d2, which is slightly greater than the aforementioned first distance d1. As will therefore be appreciated, the raised linear portions 3e thus all lie in a common plane which is parallel to the plane of the base 2, and which is spaced somewhat further from the base 2 than the corner regions.

The base 2 and the side wall 3 may be mould-formed as a unitary piece. In other embodiments, however, the side wall 3 may be formed in one or more pieces and the base 2 may be formed as a separate piece, with the base 2 and the side wall 3 being sealingly connected together.

The housing 1 contains electronics, which optionally comprise one or more components. FIG. 1 shows a capacitor 5 retained in a predetermined position inside the housing 1 by a gripping structure 6. The gripping structure 6 includes finger portions protruding from the base 2 which are sized and positioned so as to receive and grip the capacitor 5. The finger portions are positioned so as to retain the capacitor 5 in the gripping structure 6 by virtue of friction between the finger portions and the surface of the capacitor 5. The finger portions are positioned on opposite sides of the capacitor 5. In FIG. 1, the inner surfaces of each finger portion which contact the capacitor 5 are curved towards respective opposing finger portions so that the distance between the ends of the finger portions farthest from the base 2 is somewhat smaller than the largest width of the capacitor 5. The finger portions are resiliently deformable so that the capacitor 5 can be pushed between the ends of the finger portions so as to adopt its illustrated position, whereupon the capacitor 5 becomes clampingly positioned between the ends of the finger portions, and is urged towards the base 2. In this way, the ends of the finger portions can provide a force towards the base 2 to further retain the capacitor 5 in its position in the housing 1. The capacitor 5 is thus securely gripped by the finger portions 6 as an interference fit.

In other embodiments, the finger portions may extend from the side wall 3 or another part of the housing 1 rather than the base 2.

In other embodiments, only one finger portion may be provided and the gripping structure 6 may be configured to grip the component against another part of the housing 1, such as the base 2 or the side wall 3. In such embodiments, the other part of the housing 1 may act as the opposing finger portions.

In other embodiments, the gripping structure 6 may be configured to receive another type of component and so the finger portions may be sized and positioned so as to receive a different configuration of component.

The housing 1 of FIG. 1 has a connector 7 for connecting the electronic components within the housing 1 to electronics outside of the housing 1. The connector 7 is positioned at the front portion 3a of the side wall 3. The connector 7 has an array of connector pins 8 which each define an electrical connecting point inside the housing 1 and a respective corresponding electrical connecting point outside of the housing 1. The connector pins 8 provide respective electrical paths through the side wall 3 of the housing 1 whilst maintaining the water-tight properties of the side wall 3. The connector pins 8 of FIG. 1 extend from the outside of the housing 1, through the side wall 3 and into the housing 1 from the side wall 3. The connector pins 8 extend through the side wall 3 generally perpendicular to the side wall 3. The portion of each pin inside of the housing 1 is bent so that an end region of the pin turns upwardly to extend away from the base 2. Outside of the housing 1, the connector pins 8 are arranged in an array to complement a plug which can be externally connected to the connector 7, in a manner known per se.

The connector 7 also has a plug-locating rim 42 extending outwardly from the side wall 3, the rim 42 extending around the connector pins 8 such that the connector pins 8 are located within the rim. The plug-locating rim 42 encloses an area of the front portion 3a of the side wall 3 and is sealed against the side wall 3. The plug-locating rim 42 and pins 8 are complementary to a plug to be received by the connector. More particularly, the rim 42 is complementary to a recess in the plug so that the plug-locating rim 42 may be received within the recess of the plug so as to hold the plug and connector together by an interference fit. The arrangement of the rim 42 and pins is such that when the rim 42 is received in the recess of the plug the connector pins 8 align with the corresponding conductive recesses in the plug. The rim 42 is generally rectangular with rounded corners, and it extends outwardly from the side wall 3 by a distance which is somewhat greater than the distance by which the connector pins 8 extend outwardly from the side wall 3, the rim 42 thereby protecting the connector pins 8 from damage in the absence of a connected plug. The rim 42 may have protrusions 43 on its upper and lower outer surfaces which correspond to recesses in the plug, such that when the plug is engaged with the connector, the recesses grip the protrusions 43 to further hold the plug and connector together via an interference fit.

The connector 7 may also have stabilising or locating projections 40 extending from the side wall 3 between the connector pins 8, the locating projections 40 corresponding with cooperating locating recesses in the plug to be received. These projections 40 act to locate the connector 7 and the plug relative to one another to avoid accidental misalignment when the two are interconnected, and may also serve to maintain the plug in place and absorb forces caused by movement of the plug, preventing them from being transferred to the connector pins 8 and thereby causing damage.

Figure 3:
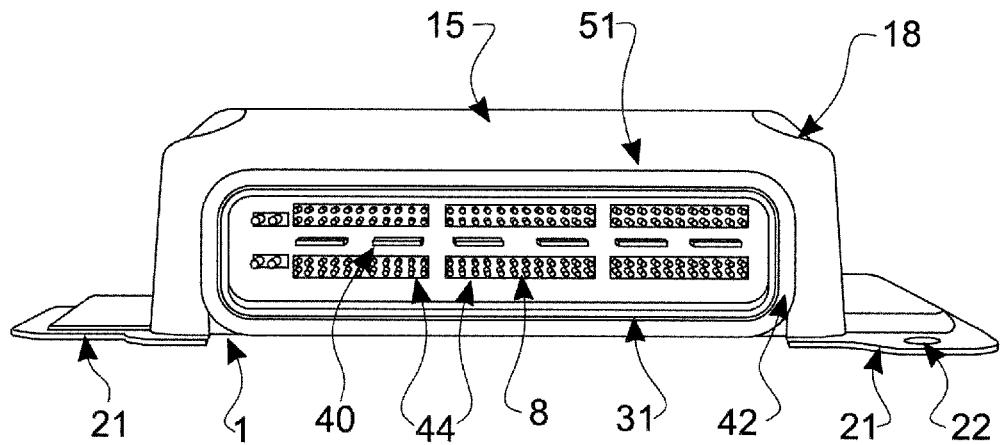
FIG. 3 is a front view of an electronic control unit casing according to the present invention.

The connector 7 can be seen in more detail in FIG. 3. The pin areas 44 are openings in the housing. The pins 8 are then inserted through these openings from the inside of the housing. The pins 8 may be clipped or fastened in some other manner to the inside of the housing. The pins 8 may be part of an assembly of pins, the assembly being formed separately from the housing and then inserted through the openings from the inside of the housing. Preferably, an assembly of pins may be attached to an electronic component, such as a PCB, to be installed in the housing. Then, the assembly of pins is inserted through the openings when the electronic component is installed in the housing.

In this embodiment, the pin areas 44 may not be sealed in a water-tight manner, so the connector 7 may be configured so that when a plug is connected, a water-tight seal 31 is formed around pin areas 44 so that liquid cannot enter the housing 1 through the pin areas 44 of the connector.

In some embodiments, the connector 7 and the housing 1 sidewalls are formed integrally as a single piece for example, by over moulding pins 8. This can improve the water-tightness of the casing and the ease of assembly.

Figure 2:
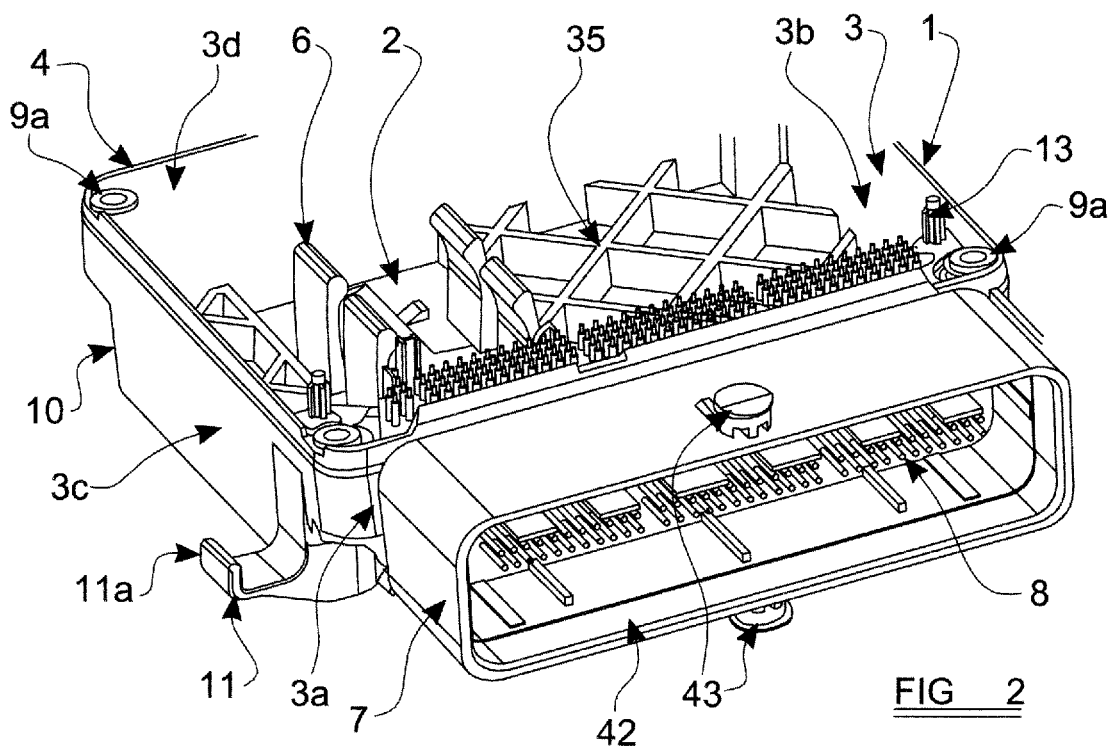
FIG. 2 is a perspective view of a housing of an electronic control unit according to the present invention.

The connector 7 shown in FIG. 2 is formed as a single piece together with the rest of the housing 1. The connector pins 8 are over moulded in their respective positions in the connector 7. Constructing the connector in this manner reduces the possibility of leakage occurring through the connector because no seams are required between separately formed neighbouring components.

Other embodiments may not have a connector 7 and may instead contain a wireless connecting means which enables electronics within the housing 1 to communicate with electronics outside of the housing 1. Still further embodiments may have a connector 7 in the cover 15 rather than the housing 1.

The housing 1 of FIG. 1 also has four support posts 9. The support posts 9 are located proximal to each corner of the housing 1 and are attached to or formed integrally with the side wall 3, on the inner side thereof. Each support post 9 defines an upwardly (in the orientation illustrated in FIG. 1) directed support surface 9a on which a portion of a circuit board can rest inside the housing 1. The support surfaces 9a are positioned inside of and proximal to the peripheral edge 4, at a position which is slightly below the corner regions of the peripheral edge 4. In other embodiments more or fewer than four supports posts 9 may be provided.

The support posts 9 each have an upwardly open central bore or recess into which a fastener such as a threaded screw can be inserted and engaged. As will thus be noted, the support surfaces 9a are thus generally annular in shape, extending around the open end the respective bore or recess.

The housing 1 also has cutaway portions 10 at each corner of the back of the housing 1, where a portion of the side wall 3 is recessed proximal to the base 2. The base 2 also has corresponding recesses in each of its corners proximal to the back portion 3d of the side wall 3 so as to match the shape of the side wall 3 proximal to the base 2. The presence of the cutaway portions 10 reduces the overall amount of material required to produce the housing 1 and improves the strength of the housing.

The embodiment of the housing 1 illustrated has two opposing guide portions 11 for interlocking with corresponding parts of a cover, in a manner which will be described in more detail hereinafter. The guide portions 11 of the housing extend outwardly from respective side portions 3b, 3c of the side wall 3 proximal to the base 2. Each guide portion 11 terminates in an upwardly turned lip 11a which is spaced outwardly from the respective side portion of the side wall 3.

In other embodiments there may be only one guide portion 11 in the housing. In other embodiments, guide portion(s) 11 may extend from any part of the housing 1 and be of any convenient shape.

The housing 1 also has internal metal traces 12 which are fixed to the housing 1 by struts. The struts extend upwardly from the base 2 and the traces 12 are located at the end of the struts farthest from the base 2. The traces 12 are positioned so that they will engage with cooperating contacts on a circuit board, when the circuit board is positioned on the support surfaces 9a.

The housing 1 also contains two circuit board locating pins 13. The locating pins 13 extend upwardly from the base 2 inside and generally adjacent the peripheral side wall 3.

The two locating pins 13 are located proximal to opposing portions of the side wall 3. Other embodiments may have only one locating pin or more than two locating pins 13. In other embodiments, locating pins 13 may extend from the side wall 3 or another part of the housing 1.

The base 2, side wall 3, support posts 9, locating pins 13, struts 12, guide portions 11 and locating rim 42 may conveniently be mould-formed as one unitary piece for simplicity of manufacture, and to ensure substantially liquid-tight cooperation. In other embodiments some or all of these parts may be formed separately and subsequently joined in a substantially liquid-tight manner, for example via a suitable adhesive.

It is to be appreciated that the housing 1 may have various other features which are not specifically illustrated in FIG. 1. For example, as shown in FIG. 2 a modified version of the housing 1 is illustrated which includes internal structural supports 35 which project from the base 2 inside of the housing 1 and extend between portions 3a, 3b, 3c, 3d of the side wall 3. The supports 35 form a lattice which enhances the strength of the housing 1.

Figure 4:
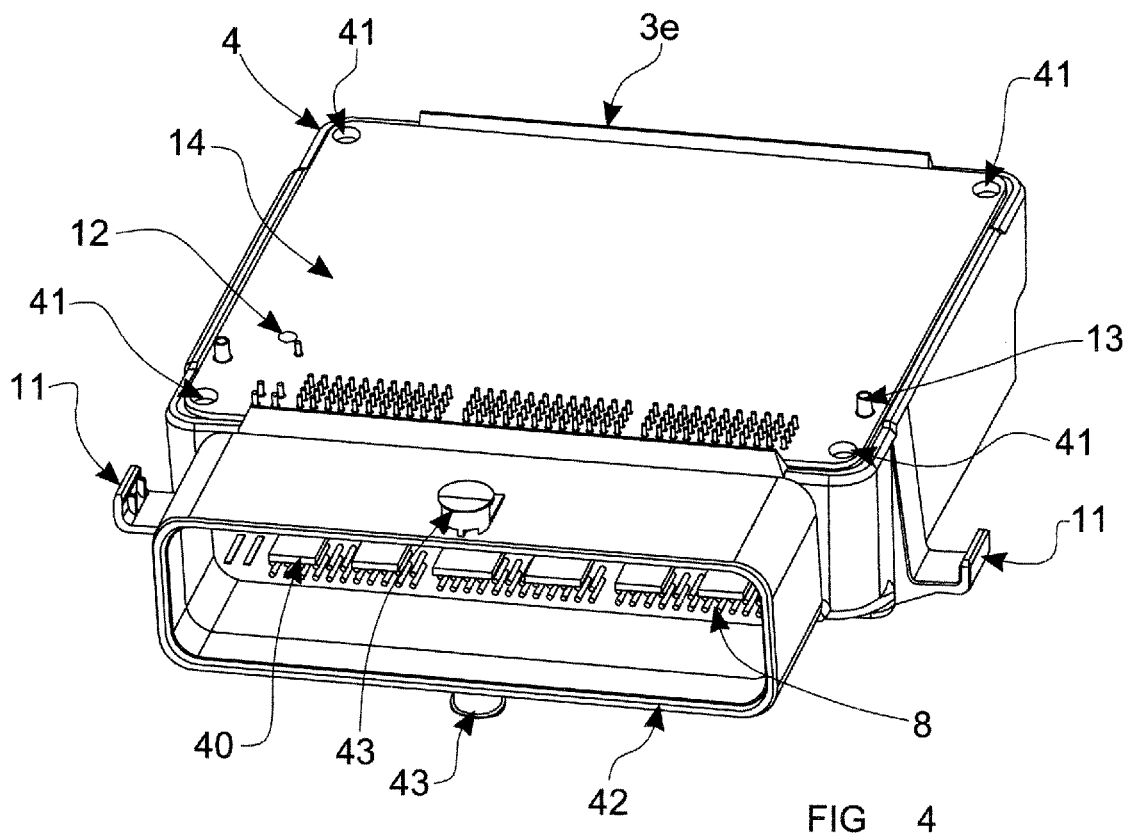
FIG. 4 is a perspective view of the housing of FIG. 1, showing a printed circuit board located within the housing.

FIG. 4 shows the housing 1 containing a circuit board, which may optionally be a printed circuit board (PCB) 14. The PCB 14 is located proximal to the access opening.

The shape of the PCB 14 matches the shape inside of the peripheral edge 4 so that the PCB 14 makes full use of the space available in the housing 1. The PCB 14 of FIG. 4 is thus substantially rectangular with rounded corners. Advantageously, the PCB 14 may be shaped and sized so as to match the shape and size of the access opening, thereby making use of the maximum available space in the housing.

The PCB 14 has four circuit board mounting holes 41, each being located proximally to a respective corner of the PCB 14. The PCB 14 further has two locating holes sized and positioned to receive respective locating pins 13. The locating holes are thus located proximal to two opposing edges of the PCB 14.

The PCB 14 is located on the support surfaces 9a, and the circuit board holes 41 in the PCB 14 align with the bores or recesses in the support posts 9 so that a fastener such as threaded screws can be inserted or screwed through the circuit board holes 41 and into the bores or recesses in the support posts 9. The locating pins 13 are positioned in respective locating holes in the PCB 14 so as to ensure the PCB 14 is located in its predetermined position within the housing.

The side wall 3 projects slightly above the PCB 14, at least at its raised linear sections 3e, so that the whole of the PCB 14 is located inside the housing. The PCB 14 is mounted in the housing so as to extend across the access opening for ease of assembly. In other embodiments the PCB 14 may be located elsewhere within the housing.

The PCB 14 in FIG. 4 is located distal from the base 2 so that when the housing 1 is mounted with an orientation so that the base 2 is at the bottom of the housing 1, as illustrated, the PCB 14 is located at the top of the housing 1. Other embodiments may have the PCB 14 located in a different location in the housing 1.

The PCB 14 is mounted so that its electrical connections are facing the base 2. This enables the PCB 14 to be more easily connected with other components in the housing 1 such as the capacitor 5.

The metal traces 12 contact the PCB 14 and allow the connection of the capacitor 5 to the PCB 14 electronics. The inward ends of the connector pins 8 make contact with receiving contacts in the PCB 14 so that the electronics on the PCB 14 can be connected to electronics outside of the ECU via the connector 7. The connector pins 8 are arranged so as to match the arrangement of connections on the PCB 14.

In other embodiments, the circuit board may not be printed and may have components mounted on it via wire bonds. In other embodiments, the PCB 14 may be replaced by electrical componentry that is not located on a circuit board.

Figure 5:
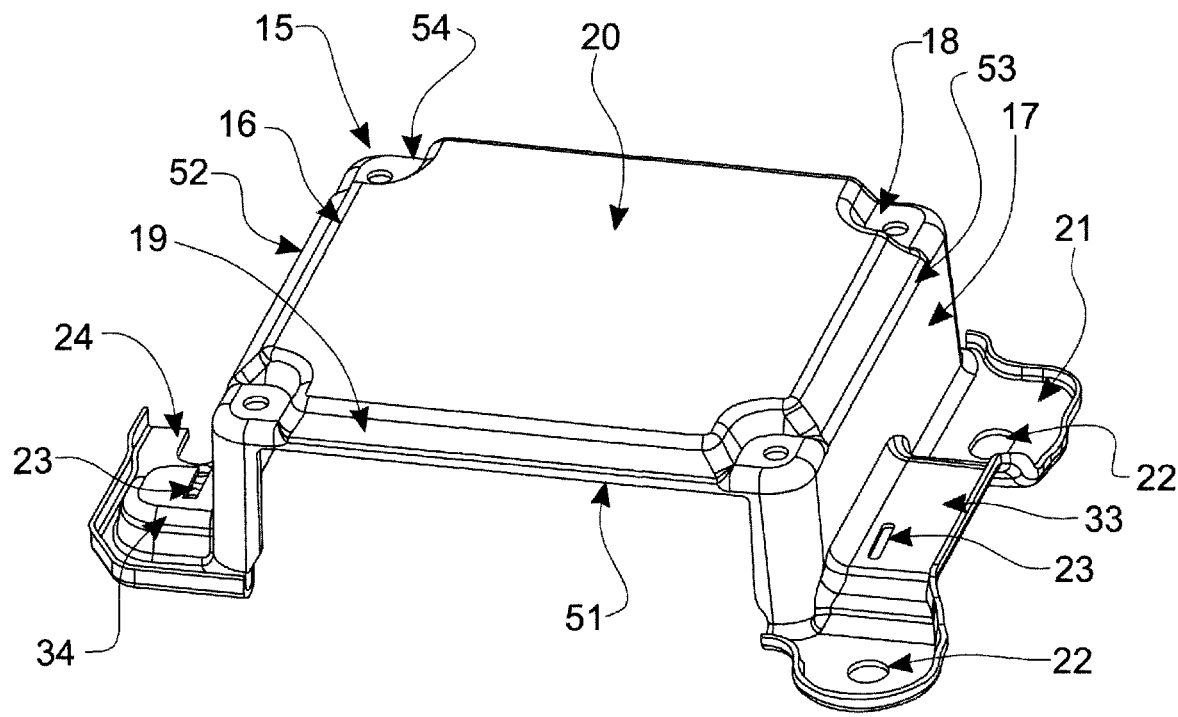
FIG. 5 is a perspective view of a cover of an electronic control unit casing according to the present invention.

FIG. 5 shows a cover 15 of an ECU casing according to the present invention. The cover will be described with reference to the orientation shown in FIG. 5 for ease of reference, but it will be appreciated that the absolute orientation of the components may be altered as long as the relative orientations of the components of the cover are maintained.

The cover 15 shown in FIG. 5 has a generally horizontal rectangular part 16. The perimeter of the rectangular part 16 has four straight portions; a front edge 51, two opposing side edges 52, 53 and a back edge 54. These straight edges meet at rounded corner edges. The cover further includes a generally upright wall 17 which depends from the perimeter of the rectangular part in the form of a skirt. The upright wall 17 depends from the back edge 54, both opposing side edges 52, 53, all of the corner edges, and from end portions of the front edge 51 proximal to each front corner. There is a gap in the upright wall 17 beneath the central region of the front edge 51. The region inside of the upright wall 17 and beneath the rectangular part may be considered to be inside of the cover, and regions outside of the upright wall 17 and/or above the rectangular part may be considered to be outside of the cover.

A foot portion 21 extends horizontally outwardly from each of the portions of the upright wall 17 that depend from each of the opposing side edges 52, 53 and their respective rounded corner edges. A first foot portion 21 (on the right-hand side of FIG. 5 as illustrated) includes mounting holes 22 so that a fastener such as bolts can be inserted through the holes to mount the cover 15 to a surface inside a motor vehicle. The second foot portion 21 (on the left-hand side of FIG. 5 as illustrated) has a recess 24 rather than a hole, so that a clamping or a fastener can engage with this recess to mount the cover to the surface.

Each foot portion 21 has a ridge on the outer edge of the foot portion 21 which protrudes vertically upwardly from the foot portion in the manner of a lip.

Each foot portion 21 has a respective raised part 33, 34 which is formed so as to extend from the upright wall 17 at a position which is higher than the rest of the foot portion 21, and which is thus closer to the rectangular part 16. In the first foot portion 21, the raised part is formed as a bridge 33 between two lower surfaces either side of the raised part 33. In the second foot portion 21, the raised part 34 extends outwardly from the upright wall 17 at a location higher than the rest of the foot portion, but then extends downwards and further outwards at the same height as the rest of the foot portion. Raised parts 33 and 34 provide extra strength to the cover 15. The raised parts 33 and 34 may have different shapes according to the intended fitting location in a vehicle in order to allow fitment in the intended location.

Each raised part 33, 34 defines a slot 23 through the foot portion. The slots 23 are proximal to respective opposing parts of the upright wall.

The rectangular part 16 has a roof section which is formed by diagonal walls 19 and a raised central section 20. The diagonal walls 19 slope inwardly and upwardly (away from the upright wall 17) from the perimeter of the rectangular part 16. The raised section 20 joins the edges of the diagonal roof walls 19 farthest from the perimeter of the rectangular part 16. Thus the raised section 20 is raised above the plane of the perimeter.

The edges between the diagonal walls 19 and the raised section 20, and between the diagonal walls 19 and the perimeter of the closure part 16 are rounded or chamfered.

In other embodiments, the roof section may be defined by walls which are perpendicular to the raised section 20 and extend from the perimeter directly away from the mounting portion rather than diagonally. In other embodiments the diagonal walls 19 may extend from a place inwards of the perimeter. In other embodiments, some sections of the diagonal walls 19 may extend from the perimeter of the rectangular part 16 and some sections of the diagonal walls 19 may extend from a place inwards of the perimeter of the rectangular part 16.

In the particular embodiment illustrated in FIG. 5, the rectangular part 16 has a flat corner region 18 at each corner. The flat corner regions 18 extend inwardly from the perimeter of the rectangular part 16 to form inwardly directed shoulders. The flat corner regions 18 extend horizontally (perpendicularly to the direction in which the upright wall 17 extends from the rectangular part 16) inwardly from the corner edges of the perimeter. The flat corner regions 18 each define a hole through the cover 15 through which a fastener such as a threaded screw can be inserted. Proximal to the flat corner regions 18, the diagonal walls 19 extend from the inner edge of the flat corner regions 18 inwards and away from the upright wall 17 instead of extending from the perimeter of the rectangular part 16.

As will become clear, the cover 15 defines a closure part configured to engage with the housing 1 to close the access opening, and a mounting portion configured to be mounted to a mounting surface 27 in a vehicle. In the cover shown in FIG. 5, the closure part is defined by the rectangular part 16, and the mounting portion is defined by the upright wall 17 and the outwardly directed foot portions 21. The rectangular part is configured to engage with the access opening of the housing 1 to close the access opening. The foot portions are configured to be mounted to a mounting surface.

The mounting portion depends from the closure part by virtue of the upright wall 17. In FIG. 5, the mounting portion depends from the back edge 54, both opposing side edges 52, 53, all of the corner edges and from end portions of the front edge 51 proximal to each front corner of the perimeter of the rectangular part.

In other embodiments, the mounting portion may extend from only one side of the perimeter of the closure part, or from two opposing sides of the perimeter, or from all of the sides of the perimeter of the closure part. Alternatively, the mounting portion may extend only from one point on the perimeter of the closure part 16, or from several points on one or more edges of the perimeter or from one or more corners of the perimeter. The mounting portion in FIG. 5 depends from the perimeter of the closure part 16 perpendicularly to the plane of the perimeter. In other embodiments, the mounting portion may depend diagonally outwards of the perimeter of the closure part 16.

In other embodiments, there may be only one foot portion 21 and the foot portion or foot portions 21 may extend from any part or parts of the mounting portion distal to the closure part 16.

Each foot portion 21 defines at least one contact surface facing away from the closure part 16 that is suitable to contact a mounting surface 27 in a vehicle on which the casing is to be mounted.

Each foot portion 21 of the cover 15 of FIG. 5 has a guide portion. The guide portions are formed by the slots 23 in the foot portions, and correspond to the lips 11*a* of guide portions 11 of the housing 1 so that when the cover 15 and housing 1 inter-engage so as to close the access opening, the lips 11*a* of the guide portions 11 interlock with the slots 23. The slots 23 have a complementary shape to the lips 11*a* so that the lips 11*a* can interlock with the slots 23. The slots 23 are positioned so that when the lips 11*a* are located in the slots, the cover 15 and housing 1 are relatively positioned so that the closure part 16 closes the access opening. In other embodiments, the guide portions may not be formed by slots, but by some other shape complementary to a guide portion of the housing.

Figure 6:
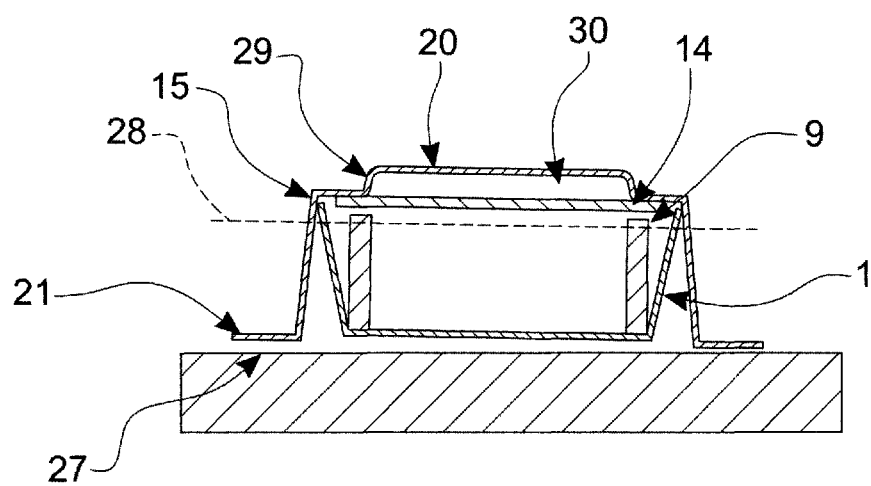
FIG. 6 is a cross-sectional schematic view of an electronic control unit according to the present invention.

FIG. 6 shows the cover 15 and housing 1 inter-engaged to close the access opening in the housing 1. The cover 15 is positioned over the housing 1, such that the peripheral edge 4 of the housing 1 engages with the perimeter of the closure part 16 in order to close the access opening of the housing 1. The mounting portion extends alongside the sidewall of the housing 1 and the foot portions may be fastened to a mounting surface 27 of a vehicle so as to mount the casing on the mounting surface 27.

The housing 1 and cover 15 are substantially as described above, but differences and important features are discussed further below.

The mounting portion of the embodiment shown in FIG. 6 depends diagonally from the perimeter of the closure part 16. The side wall 3 of the housing 1 extends diagonally upwards and outwards from the periphery of the base 2. The perimeter of the closure part 16 is in a plane parallel to the plane of the base 2. The foot portions 21 extend away from the housing 1 and are mounted on the mounting surface 27 of the motor vehicle.

The mounting portion depends alongside the side wall 3 of the housing 1. The contact surface of the foot portion 21 is spaced from the peripheral edge 4 of the housing 1 by an equal or greater distance than that by which the base 2 is spaced from the peripheral edge 4. When the casing is mounted on a mounting surface 27, the peripheral edge 4 is spaced from the mounting surface 27 by at least the distance by which the peripheral edge 4 is spaced from the base 2.

In some embodiments, when inter-engaged, the cover 15 and housing 1 may form a water tight seal at the interface between the cover 15 and the housing 1. This seal may be formed between the peripheral edge 4 of the housing 1 and the perimeter of the closure part 16 of the cover 15 by virtue of their engagement alone or by the application of a waterproof sealant material.

The interface between the cover 15 and the housing 1 is distal from the contact surfaces of the foot portions 21. Thus, when the casing is mounted on a horizontal surface, the interface between the cover 15 and the housing 1 is at the top of the casing. This means that even if the interface between the cover 15 and the housing 1 does not form a perfect water-tight seal, any water that enters the casing, must enter at the top of the casing. Thus as long as the water level is lower than the peripheral edge 4, water cannot enter the casing even if the seal is not perfect.

In embodiments where the housing 1 includes a portion which protrudes inwards from the peripheral edge 4 to define an access opening inside of the peripheral edge 4, the closure part 16 may engage this portion rather than the peripheral edge 4 so as to close the access opening. In other embodiments, the closure part 16 may engage the side wall 3 around the peripheral edge to close the access opening.

The mounting portion in FIG. 6 substantially covers all of the housing 1 except the base 2 and the connector 7. In other embodiments, the mounting portion may extend alongside only one portion of the side wall 3 when the cover 15 engages the housing 1 to close the access opening, or it may extend alongside two opposing regions of the side wall 3 or all portions of the side wall 3.

As is shown in FIG. 6 and in FIG. 7, the water level 28 is below the peripheral edge of the side wall of the housing. So, if water is present up to the water level 28, water cannot enter the casing even when the housing 1 and cover 15 are engaged loosely around the peripheral edge so as not to form a perfect water tight seal around the access opening. Thus a casing with an imperfect seal around the peripheral edge will still not allow water at the height of the water level 28 to enter the casing.

The water level 28 may be 20 mm from the mounting surface. Thus in embodiments which are configured for a water level 28 of 20 mm, the height between the contact surface of the foot portion 21 and the peripheral edge 4 is equal to or greater than 20 mm. Thus the mounting portion is configured to mount the casing to a mounting surface 27 so that the peripheral edge 4 is spaced from the mounting surface 27 by at least the water level 28, which may be 20 mm.

In the embodiment shown in FIG. 6, the height of the sidewalls from the base 2 to the peripheral edge 4 is less than the height of the mounting portion from the contact surface to the closure part 16 and so when the casing is mounted on a mounting surface 27, the base 2 is suspended above the mounting surface 27.

The support posts 9 extend from the base 2 proximal to the side wall 3 of the housing 1. The PCB 14 is located on the support posts 9 and the cover 15 is placed over the housing 1 so that the perimeter of the closure part 16 of the cover 15 engages the peripheral edge 4 of the housing 1. The closure part 16 is fastened to the support posts 9 in the housing 1, thereby clamping the PCB 14 in its position in the casing. This reduces the effects of vibrations on the PCB 14 as it is held firmly in position and cannot move.

Figure 7:
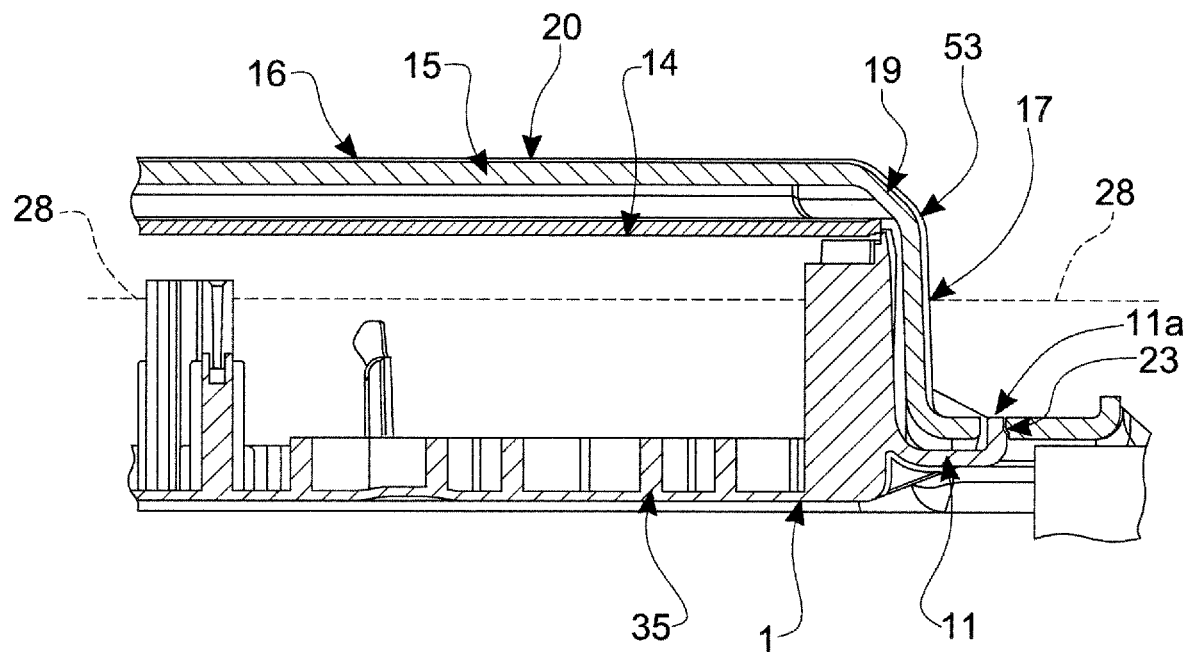
FIG. 7 is a cross-sectional view of an electronic control unit according to the present invention.

The PCB 14 is located proximal to the top of the housing in the orientation of FIG. 6 and FIG. 7. Thus, the water level 28 is below the PCB. So, even if a small amount of water is present inside the housing, for example below the water level 28 (for example due to gaps in the connector) it will remain well below the PCB and so water-damage to the PCB is avoided.

The raised section 20 is spaced from the access opening and the PCB 14 by roof section walls 29. This provides a heat dissipation chamber 30 between the PCB 14 and the roof section 20. The walls of the roof section of this embodiment do not extend from the perimeter of the closure part 16, but instead from a place inwards of the perimeter on the closure part 16. In other embodiments, all of the closure part 16 may be made up of the roof section and fastening regions 18. In other embodiments, the raised section 20 may form only a small portion of the closure part 16 and the heat dissipation chamber 30 may be located proximal to components of the electronics of the ECU that produce the most heat.

In embodiments where the cover 15 and housing 1 are loosely engaged, the interface between the closure part 16 and the housing 1 may provide ventilation to the casing.

Figure 8:
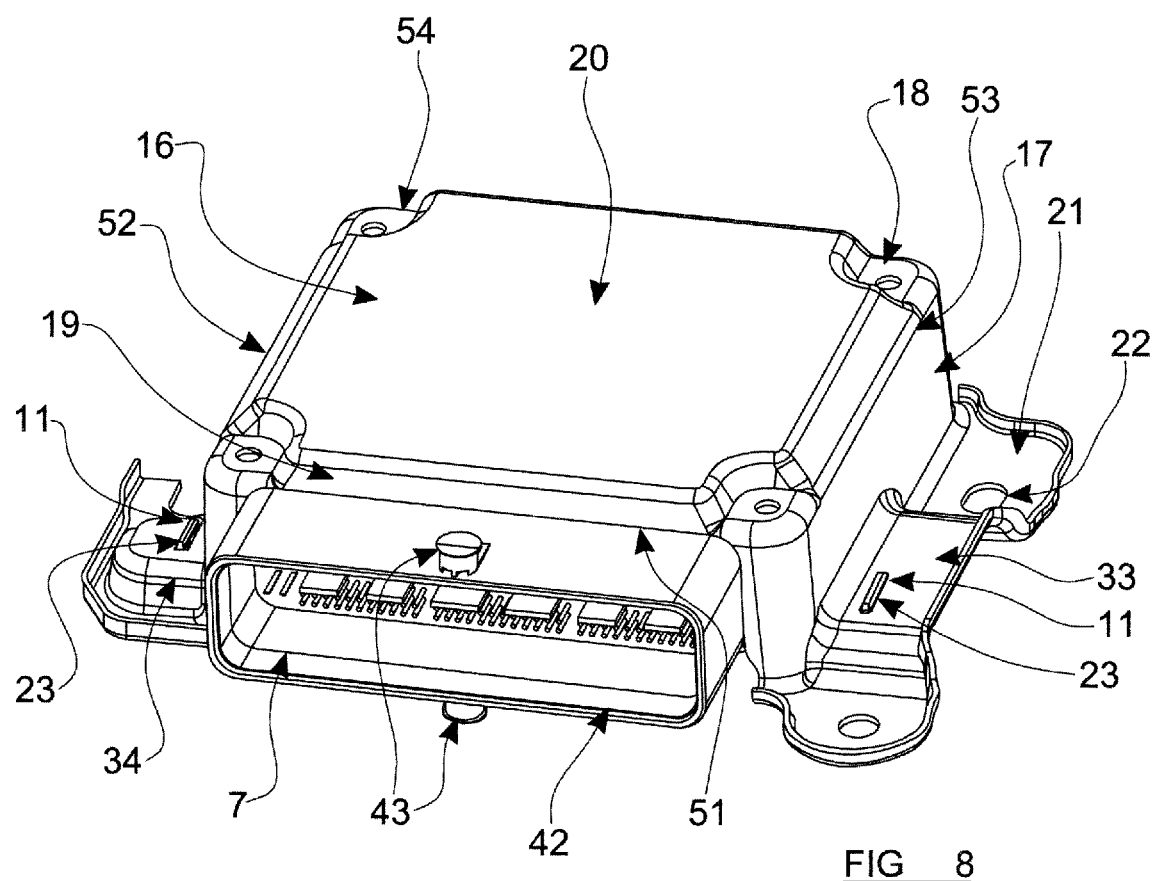
FIG. 8 is a perspective view of an electronic control unit casing according to the present invention, the casing including the housing of FIGS. 1 and 4 and the cover of FIG. 5.

Turning to FIG. 8, the housing 1 of FIGS. 1 and 4 and the cover 15 of FIG. 5 are illustrated in an inter-engaged configuration so as to close the housing 1.

The mounting portion of the embodiment shown in FIG. 8 depends vertically from the perimeter of the closure part 16. The side wall 3 of the housing 1 extends vertically upwards from the periphery of the base 2. The perimeter of the closure part 16 is in a plane parallel to the plane of the base 2.

The cover 15 and housing 1 inter-engage in a similar manner to the embodiment of FIG. 6, but differences and important features will be further discussed below.

The perimeter of the rectangular part 16 of FIG. 5 is configured to engage the peripheral edge 4 of the housing 1 of FIGS. 1 and 4, as shown in FIG. 8, in order to close the housing 1. Thus the perimeter of the rectangular part 16 is substantially the same size and shape as the peripheral edge 4 of the housing 1 of FIGS. 1 and 4. In other embodiments of the invention, a closure part may be configured to engage with the side wall 3 of the housing 1 at another location or to engage with another part of the housing 1 such as a portion extending inwards from the peripheral edge 4 to define a smaller access opening. In other embodiments, the cover 15 may have a vent aperture through the raised section 20.

The flat corner regions 18 act as fastening regions. The holes in each of the flat corner regions 18 align with the holes in the PCB 14 and the bores or recesses in the support posts 9. A fastener such as a threaded screw can be inserted through each hole in the flat corner regions 18, through the aligned and corresponding mounting hole 41 in the PCB 14 and into the aligned and corresponding bore or recess in the support posts 9 to thereby secure the cover 15 to the housing 1, and to clamp the PCB 14 in its position in the housing 1. The cutaway portions 10 are located beneath the support posts 9 and the cutaway portions 10 act to improve the strength of the housing around the support posts 9, thereby preventing damage to the housing during fastening.

The inwardly directed shoulders defined by the corner regions 18a of the cover 15 contact the PCB 14 which is located on the support posts 9, and so clamp the PCB 14 against the support posts 9 when the fasteners are in place. In other embodiments, the PCB 14 may be clamped in position by a clamping arrangement that is separate from the fastener or by virtue of the inter-engagement of the cover 15 and housing 1.

The mounting portion extends outside of and alongside the side wall 3 of the housing 1. The mounting portion extends parallel to the side wall 3. The connector 7 is positioned in the gap in the front portion of the mounting portion so that the mounting portion surrounds the rim 42 of the connector 7 above and at its sides.

The lips 11a of the guide portions 11 of the housing 1 interlock with the slots 23 of the cover 15 to ensure that the cover 15 and the housing 1 are relatively positioned so that the closure part 16 closes the access opening of the housing 1.

A means of securing the cover and housing using a fastener inserted through holes in the flat corner regions and into the bore or recess of the support posts has been described above, but it will be appreciated that alternative means of securing the cover and the housing in their relative positions are also possible.

Figure 9:
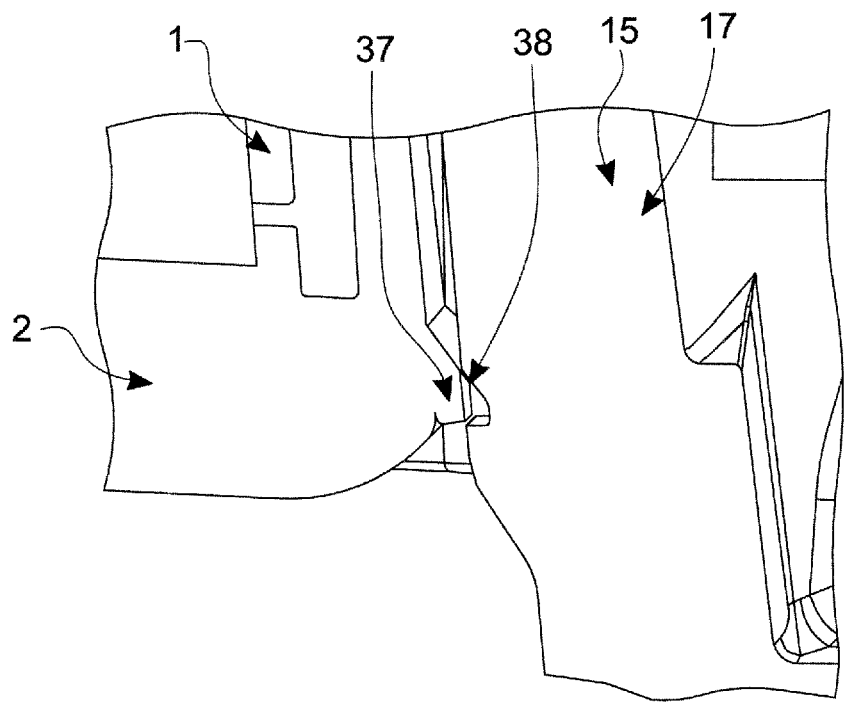
FIG. 9 is a cross-sectional view of a part of an electronic control unit casing according to the present invention.

One such alternative is illustrated in FIG. 9 which shows a snap-fit mechanism for maintaining the housing 1 and the cover 15 in their inter-engaged configuration. Thus, a fastener such as a threaded screw and support posts 9 are not necessary. In general, a snap-fit mechanism includes two snap-fit components, one on the housing and one on the cover 15. The components are positioned so that they inter-engage to retain the housing 1 and cover 15 in their relative positions, when the housing 1 and the cover 15 are inter-engaged to close the access opening.

In the snap-fit mechanism shown in FIG. 9, the snap-fit components are a snap-fit protrusion 37 on the housing 1 and a snap-fit recess 38 in the cover 15. The snap-fit protrusion 37 engages the snap-fit recess 38 when the housing 1 and the cover 15 are inter-engaged to close the access opening. The snap-fit protrusion 37 is located on the outside of the side wall 3 of the housing 1 proximal to the base 2 and the snap-fit recess 38 is located on the inner surface of the upright wall 17 of the cover 15.

When the cover 15 is pushed onto the housing 1, the snap-fit protrusion 37 and/or the housing proximal to the protrusion, is resiliently deformed to allow the cover 15 to be pushed over the housing 1. When the snap-fit protrusion 37 aligns with the snap-fit recess 38, the snap-fit protrusion 37 and/or the housing proximal to the protrusion can return to its original shape and the snap-fit protrusion 37 engages the snap-fit recess. The snap-fit protrusion 37 may have a complementary shape to the snap-fit recess 38.

In other embodiments, the snap-fit protrusion 37 and the snap-fit recess 38 may be located anywhere on the housing and cover as long as they are relatively positioned so that the two snap-fit components inter-engage when the housing 1 and the cover 15 are inter-engaged to close the access opening. Further embodiments may include one or more snap-fit mechanisms and/or one or more fasteners such as a threaded screw and support posts 9 described earlier.

Figure 10:
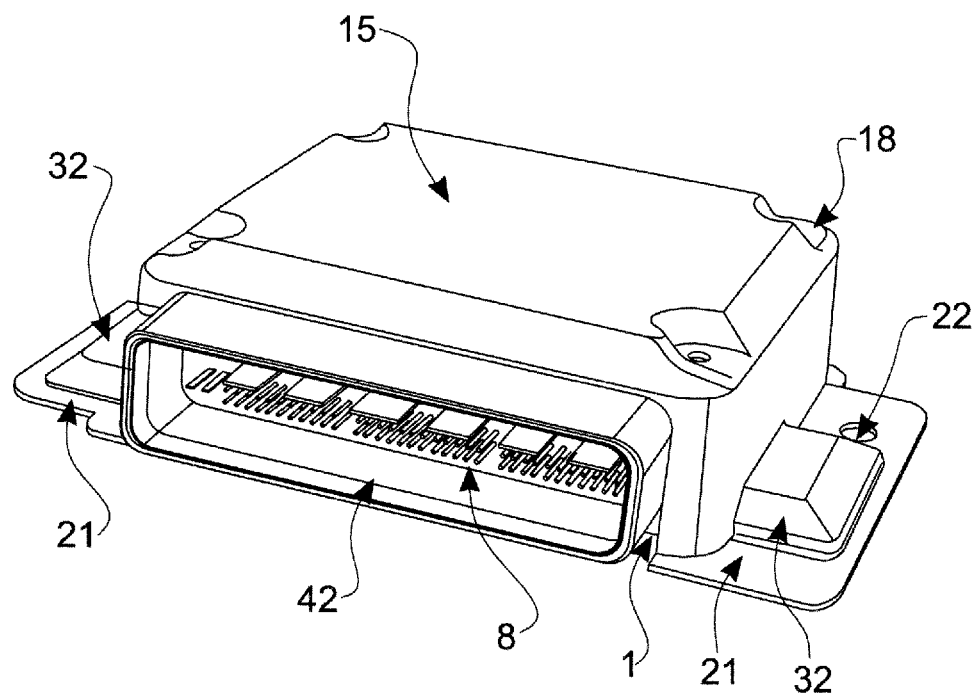
FIG. 10 is a perspective view of the electronic control unit casing of FIG. 3.

FIG. 10 shows a housing and cover where only one of the foot portions 21 is configured to be mounted to the mounting surface 27 by virtue of mounting hole 22.

When used in this specification and claims, the terms "comprises" and "comprising" and variations thereof mean that the specified features, steps or integers are included. The terms are not to be interpreted to exclude the presence of other features, steps or integers.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

While the above description constitutes the preferred embodiment of the present invention, it will be appreciated that the invention is susceptible to modification, variation and change without departing from the proper scope and fair meaning of the accompanying claims.

The invention claimed is:

1. A motor vehicle electronic control unit casing for a motor vehicle configured to be mounted to a mounting surface of the motor vehicle, comprising:
   a housing for electronic components, and a cover;
   the housing having a base, and an upstanding peripheral side wall defining a peripheral edge in spaced relation to the base and which extends around an access opening of the housing;
   the cover having a closure part being configured to close the access opening via engagement between the closure part and the housing around the peripheral edge;
   the cover having a mounting portion configured to be mounted to the mounting surface of the motor vehicle, the cover having a perimeter upright wall extending between the closure part and the mounting portion;
   wherein the mounting portion depends from the perimeter upright wall so as to extend substantially alongside and outside of the peripheral sidewall of the housing when the housing and the cover are inter-engaged to close the access opening, the mounting portion thereby being configured to secure the housing relative to the mounting surface such that the peripheral edge is spaced from the mounting surface.

2. A motor vehicle electronic control unit casing according to claim 1 further comprising, the mounting portion is configured to secure the housing relative to the mounting surface such that the peripheral edge is spaced from the mounting surface by at least a distance by which the peripheral edge is spaced from the base.

3. A motor vehicle electronic control unit casing according to claim 1 further comprising, the mounting portion is configured to secure the housing relative to the mounting surface such that the peripheral edge is spaced from the mounting surface by at least 20 mm.

4. A motor vehicle electronic control unit casing according to claim 1 further comprising, the closure part of the cover is configured to engage the housing along the peripheral edge of the housing, to thereby close the access opening of the housing.

5. A motor vehicle electronic control unit casing according to claim 1 further comprising, the housing further includes a connector for electrically connecting the electronic components within the housing to electronics outside of the housing.

6. A motor vehicle electronic control unit casing according to claim 1 further comprising, when the housing and the cover are inter-engaged to close the access opening, the mounting portion extends substantially alongside two opposing regions of the peripheral side wall.

7. A motor vehicle electronic control unit casing according to claim 5 further comprising, when the housing and the cover are inter-engaged to close the access opening, the cover substantially covers all of the housing except the base and the connector.

8. A motor vehicle electronic control unit casing according to claim 1 further comprising, the closure part has a raised section such that, when the housing and the cover are inter-engaged to close the access opening, the raised section is spaced from the access opening.

9. A motor vehicle electronic control unit casing according to claim 8 further comprising, the cover has a vent aperture through the raised section.

10. A motor vehicle electronic control unit casing according to claim 1 further comprising, the mounting portion further includes a foot portion distal to the closure part, the foot portion extending away from the housing and the foot portion being configured for securing the casing to the mounting surface.

11. A motor vehicle electronic control unit comprising a motor vehicle electronic control unit casing of claim 1 further comprising the electronic components located within the casing.

12. A motor vehicle electronic control unit according to claim 11 further comprising the electronic components located proximal to the access opening.

13. A motor vehicle electronic control unit according to claim 12 further comprising, a heat dissipation chamber is defined between the electronic components and a raised section of the cover such that, when the housing and the cover are inter-engaged to close the access opening, the raised section is spaced from the access opening.

14. A motor vehicle electronic control unit according to claim 11 further comprising, the electronic components include an electronic component which is clamped to the housing.

15. A motor vehicle electronic control unit according to claim 14 further comprising, the electronic components are clamped between the housing and the cover by virtue of inter-engagement of the housing and the cover.

16. A motor vehicle electronic control unit according to claim 11 further comprising the electronic components includes a printed circuit board mounted within the housing adjacent to a plane formed by the peripheral edge.

17. A motor vehicle electronic control unit according to claim 16 further comprising the printed circuit board is mounted within the housing by clamping between the cover and the housing as the cover is inter-engaged with the housing.

18. A motor vehicle electronic control unit according to claim 1 further comprising the cover and the housing form interfitting guide portions for locating the cover relative to the housing when the cover and housing are inter-engaged.

\* \* \* \* \*